(12) United States Patent
Cho et al.

(10) Patent No.: US 9,983,337 B2
(45) Date of Patent: May 29, 2018

(54) LIGHT EMITTING DIODE DISPLAY APPARATUS

(71) Applicant: SAMSUNG ELECTRONICS CO., LTD., Suwon-si (KR)

(72) Inventors: Seong-woo Cho, Suwon-si (KR); Dong-myung Son, Yongin-si (KR); Dae-sik Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 4 days.

(21) Appl. No.: 15/181,556

(22) Filed: Jun. 14, 2016

(65) Prior Publication Data

US 2017/0038028 A1 Feb. 9, 2017

Related U.S. Application Data

(60) Provisional application No. 62/202,290, filed on Aug. 7, 2015.

(30) Foreign Application Priority Data

Dec. 24, 2015 (KR) .................. 10-2015-0186470

(51) Int. Cl.
*F21V 9/00* (2018.01)
*G02B 5/22* (2006.01)
(Continued)

(52) U.S. Cl.
CPC ............ *G02B 5/22* (2013.01); *G02B 3/0062* (2013.01); *H01L 25/0753* (2013.01); *H01L 33/58* (2013.01)

(58) Field of Classification Search
CPC ..... G02B 5/22; G02B 3/0062; H01L 25/0753; H01L 33/58
(Continued)

(56) References Cited

U.S. PATENT DOCUMENTS

2002/0153422 A1* 10/2002 Tsikos .................. G06K 7/0004
235/454
2007/0002453 A1 1/2007 Munro
(Continued)

FOREIGN PATENT DOCUMENTS

KR 101089970 B1 12/2011
KR 1020120108479 A 10/2012

OTHER PUBLICATIONS

International Search Report and Written Opinion dated Oct. 10, 2016, issued by the International Searching Authority in counterpart International Application No. PCT/KR2016/007408 (PCT/ISA/210 & 237).

*Primary Examiner* — Karl D Frech
(74) *Attorney, Agent, or Firm* — Sughrue Mion, PLLC

(57) ABSTRACT

An LED display apparatus includes a plurality of light emitting diodes; a first microlens array disposed at an upper side of the plurality of light emitting diodes, the first microlens array comprising a plurality of first microlenses which corresponds to the plurality of light emitting diodes one-to-one and is configured to combine light received from the plurality of light emitting diodes into light bundles; and a second microlens array disposed at an upper side of the first microlens array, the second microlens array comprising a plurality of second microlenses, a number of which is larger than a number of the first microlenses included in the first microlens array, each of the plurality of second microlenses configured to cause a convergence of light that has propagated through the first microlens array.

20 Claims, 14 Drawing Sheets

(51) Int. Cl.
  *H01L 25/075* (2006.01)
  *H01L 33/58* (2010.01)
  *G02B 3/00* (2006.01)

(58) Field of Classification Search
  USPC .................................. 362/231, 242; 235/454
  See application file for complete search history.

(56) References Cited

U.S. PATENT DOCUMENTS

2007/0127098 A1    6/2007   Wood
2015/0130002 A1    5/2015   Cheng et al.
2016/0040854 A1*   2/2016   Zhang ................. H01L 25/0753
                                                                       362/242

* cited by examiner

LIGHT EMITTING DIODE DISPLAY APPARATUS

CROSS-REFERENCE TO RELATED APPLICATIONS

This application claims the benefit of U.S. Provisional Application No. 62/202,290, filed Aug. 7, 2015, in the United States Patent and Trademark Office, and claims priority from Korean Patent Application No. 10-2015-0186470, filed Dec. 24, 2015 in the Korean Intellectual Property Office, the disclosures of both of which are incorporated herein by reference in their respective entireties.

BACKGROUND

1. Field

Exemplary embodiments relate to a light emitting diode (LED) display apparatus. More particularly, one or more exemplary embodiments relates to an LED display apparatus for which bright room contrast can be enhanced and intervals between light sources are not recognized.

2. Description of the Related Art

In accordance with the development of the light emitting diode (LED), LED display apparatuses are widely used as display apparatuses.

An LED display apparatus 1, as illustrated in FIG. 1, includes a plurality of light emitting diodes 5 attached on a printed circuit board 3. One light emitting diode 5 corresponds to one pixel. The plurality of light emitting diodes 5 includes red light emitting diodes R configured to emit red light, green light emitting diodes G configured to emit green light, and blue light emitting diodes B configured to emit blue light.

Conventional LED display apparatuses 1 have a problem that the bright room contrast is generally of relatively poor quality.

In detail, when external light L is incident to the LED display apparatus 1, the external light L is reflected by a top surface of the printed circuit board 3 on which the plurality of light emitting diodes 5 are disposed and by the plurality of light emitting diodes 5. Accordingly, when the LED display apparatus 1 represents black, complete black may be not seen, and reflected light may be seen. As a result, contrast between black and white is reduced such that image quality is degraded.

In order to address this problem, as illustrated in FIG. 2, a method of absorbing the external light by disposing a black structure 7 of a mash form in gaps between the plurality of light emitting diodes 5 on the top surface of the printed circuit board 3 on which the plurality of light emitting diodes 5 of the LED display apparatus 1' is disposed has been proposed.

In the case of the LED display apparatus 1' as illustrated in FIG. 2, the external light L1 incident to the mash structure 7 is absorbed without being reflected by the mash structure 7, so that reflectivity may be reduced, as compared with the LED display apparatus 1 of FIG. 1.

However, in the case of the LED display apparatus 1' as illustrated in FIG. 2, the phenomenon of the external light L2 incident on the plurality of light emitting diodes 5 being reflected by the plurality of light emitting diodes 5 cannot be prevented, and as a result, the reflectivity is still relatively high. Accordingly, the LED display apparatus 1', as illustrated in FIG. 2, also has a problem that the bright room contrast is relatively poor.

Further, conventional display apparatuses have a problem in that since the distances between adjacent ones of the plurality of light emitting diodes are relatively wide, a user may recognize each of the plurality of light emitting diodes as a dot, thereby further reducing the image quality.

SUMMARY

Exemplary embodiments of the present inventive concept have been developed in order to overcome the above drawbacks and other problems associated with the conventional arrangement. An aspect of the exemplary relates to an LED display apparatus that can implement a high image quality by improving the bright room contrast and increasing the number of point light sources.

The above aspect and/or other features of the exemplary embodiments can substantially be achieved by providing an LED display apparatus, which may include a plurality of light emitting diodes; a first microlens array disposed at an upper side of the plurality of light emitting diodes, the first microlens array comprising a plurality of first microlenses, each respective one of which corresponds to a respective one of the plurality of light emitting diodes, and which is configured to redirect light received from the plurality of light emitting diodes into light bundles; and a second microlens array disposed at an upper side of the first microlens array, the second microlens array comprising a plurality of second microlenses, a number of which is greater than a number of the first microlenses included in the first microlens array, each of the plurality of second microlenses being configured to cause a convergence of light that has propagated through the first microlens array.

The LED display apparatus may include a light absorbing layer which is disposed on a surface of the second microlens array upon which focuses of the plurality of second microlenses are formed, and which comprises a plurality of openings that respectively correspond to the focuses of the plurality of second microlenses.

At least one from among the plurality of openings may be provided with a respective color filter.

The plurality of light emitting diodes may include at least one white light emitting diode configured to emit white light.

At least one from among the plurality of openings may be provided with a respective light wavelength conversion layer element.

The plurality of light emitting diodes may include at least one blue light emitting diode configured to emit blue light.

Each of the plurality of openings may be provided with a respective color filter disposed at an upper side of the corresponding light wavelength conversion layer element.

The plurality of light emitting diodes may include at least one ultraviolet light emitting diode configured to emit ultraviolet light.

Each respective light wavelength conversion layer element may include at least one from among a phosphor and a quantum dot.

The plurality of light emitting diodes may include at least one red light emitting diode, at least one green light emitting diode, and at least one blue light emitting diode.

The plurality of light emitting diodes may include at least one LED package that includes at least one red light emitting diode, at least one green light emitting diode, and at least one blue light emitting diode.

The plurality of second microlenses may be arranged in one from among a quadrangle shape and a hexagonal shape.

The first microlens array may include a first transparent sheet on which the plurality of first microlenses is formed, and the plurality of first microlenses may be formed on a first surface of the first transparent sheet, and the plurality of light emitting diodes may be provided on a second surface of the first transparent sheet which is opposite to the first surface of the first transparent sheet.

Each of the plurality of first microlenses may be formed integrally with the corresponding one of the plurality of light emitting diodes on a top surface of the corresponding one of the plurality of light emitting diodes.

The second microlens array may include a second transparent sheet on which the plurality of second microlenses is formed, and wherein the plurality of second microlenses is formed on a first surface of the second transparent sheet and arranged so as to face the first microlens array.

The focuses of the plurality of second microlenses may be formed on a second surface of the second transparent sheet which is opposite to the first surface of the second transparent sheet.

According to another aspect of one or more exemplary embodiments, an LED display apparatus may include a plurality of light emitting diodes; a first microlens array disposed at an upper side of the plurality of light emitting diodes, the first microlens array comprising a plurality of first microlenses, each respective one of which corresponds to a respective one of the plurality of light emitting diodes, and which is configured to redirect light received from the plurality of light emitting diodes into light bundles; a second microlens array disposed at an upper side of the first microlens array, the second microlens array comprising a plurality of second microlenses, a number of which is greater than a number of the first microlenses included in the first microlens array, the second microlens array being configured to cause a convergence light that has propagated through the first microlens array; and a light absorbing layer which is disposed on a surface of the second microlens array upon which focuses of the plurality of second microlenses are formed, and which comprises a plurality of openings that respectively correspond to the focuses of the plurality of second microlenses.

The plurality of light emitting diodes may include at least one red light emitting diode, at least one green light emitting diode, and at least one blue light emitting diode.

Each of the plurality of openings may be provided with at least one from among respective red color filter, a respective green color filter, and a respective blue color filter, and the plurality of light emitting diodes may include at least one white light emitting diode configured to emit white light.

Each of the plurality of openings may be provided with a respective light wavelength conversion layer element, and the plurality of light emitting diodes may include at least one from among at least one blue light emitting diode configured to emit blue light and at least one ultraviolet light emitting diode configured to emit ultraviolet light.

Other objects, advantages and salient features will become apparent from the following detailed description, which, taken in conjunction with the annexed drawings, discloses exemplary embodiments.

BRIEF DESCRIPTION OF THE DRAWINGS

These and/or other aspects and advantages will become apparent and more readily appreciated from the following description of exemplary embodiments, taken in conjunction with the accompanying drawings of which.

Throughout the drawings, like reference numerals will be understood to refer to like parts, components and structures.

DETAILED DESCRIPTION

Hereinafter, certain exemplary embodiments will be described in detail with reference to the accompanying drawings.

The matters defined herein, such as a detailed construction and elements thereof, are provided to assist in a comprehensive understanding of this description. Thus, it is apparent that exemplary embodiments may be carried out without those defined matters. Also, well-known functions or constructions are omitted to provide a clear and concise description of exemplary embodiments. Further, dimensions of various elements in the accompanying drawings may be arbitrarily increased or decreased for assisting in a comprehensive understanding.

The terms used in the present specification are only used to describe the exemplary embodiments, but are not intended to limit the scope of the present disclosure. The singular expression also includes the plural meanings, provided that the meanings are consistent in context. In the present specification, the terms "include" and "consist of" designate the presence of features, numbers, steps, operations, components, elements, or a combination thereof that are written in the specification, but do not exclude the presence or possibility of addition of one or more other features, numbers, steps, operations, components, elements, or a combination thereof.

Figure 1:
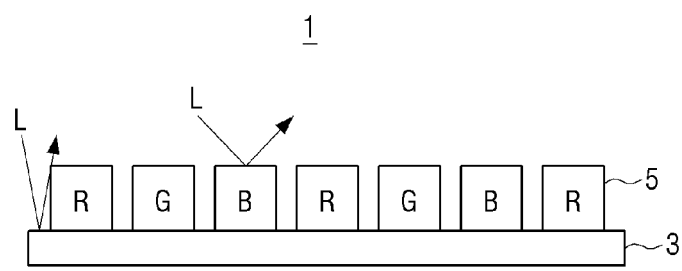
FIG. 1 is a view conceptually illustrating a conventional LED display apparatus.
Figure 2:
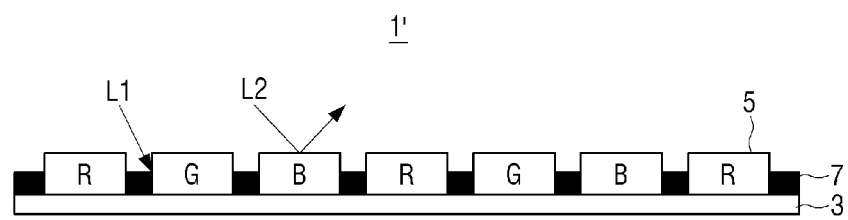
FIG. 2 is a view conceptually illustrating another conventional LED display apparatus.
Figure 3:
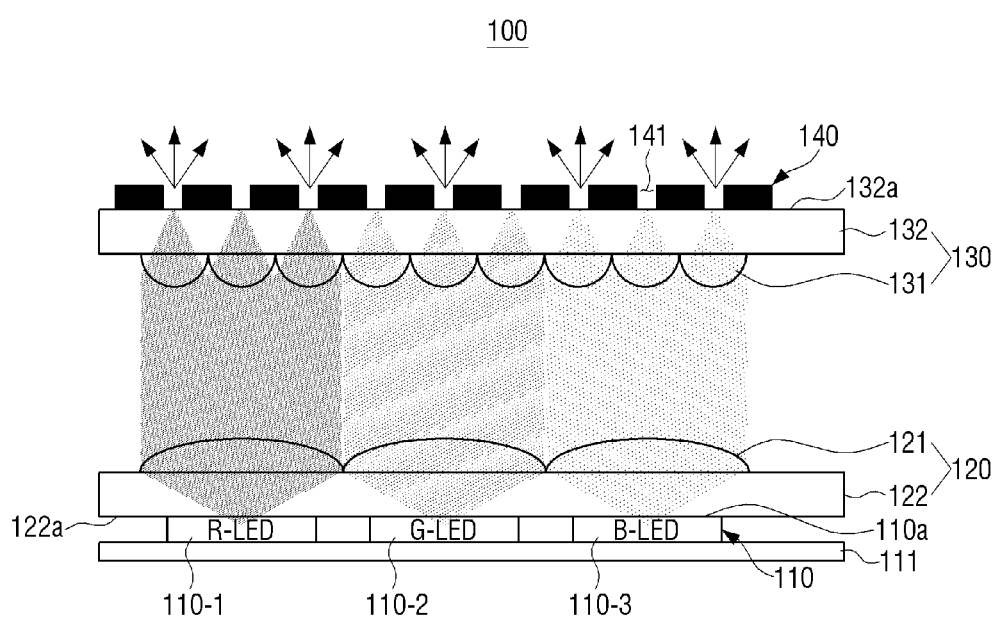
FIG. 3 is a view conceptually illustrating an LED display apparatus, according to an exemplary embodiment.

FIG. 3 is a view conceptually illustrating an LED display apparatus, according to an exemplary embodiment.

Referring to FIG. 3, an LED display apparatus 100 according to an exemplary embodiment may include a plurality of light emitting diodes 110, a first microlens array 120, and a second microlens array 130.

The plurality of light emitting diodes 110 is disposed on a top surface of a printed circuit board 111, and is controlled to display a variety of image information. The plurality of light emitting diodes 110 may include a plurality of red light emitting diodes 110-1, a plurality of green light emitting diodes 110-2, and a plurality of blue light emitting diodes 110-3 so that the LED display apparatus 100 can display a color image. However, FIG. 3 shows only three light emitting diodes 110 for convenience of illustration.

Further, the plurality of light emitting diodes 110 may be formed of a variety of LED package structures. For example, a single LED package may be formed to include a red light emitting diode, a green light emitting diode, and a blue light emitting diode. Alternatively, one LED package may be formed to include a red light emitting diode, a green light emitting diode, a green light emitting diode, and a blue light emitting diode. Alternatively, one LED package may be formed to include a red light emitting diode, a green light emitting diode, a blue light emitting diode, and a white light emitting diode.

The structure and function of the printed circuit board 111 in which the plurality of light emitting diodes 110 is disposed is the same as or similar to that of a conventional LED display apparatus. Therefore, a detailed description thereof is omitted.

The first microlens array 120 is disposed at an upper side of the light emitting diodes 110, and includes a plurality of first microlenses 121. The number of the plurality of first microlenses 121 is the same as the number of the plurality of light emitting diodes 110, such that the plurality of first microlenses 121 and the plurality of light emitting diodes 110 correspond to each other in a one-to-one correspondence. In this aspect, one first microlens 121 is disposed at the upper side of one light emitting diode 110.

Figure 4:
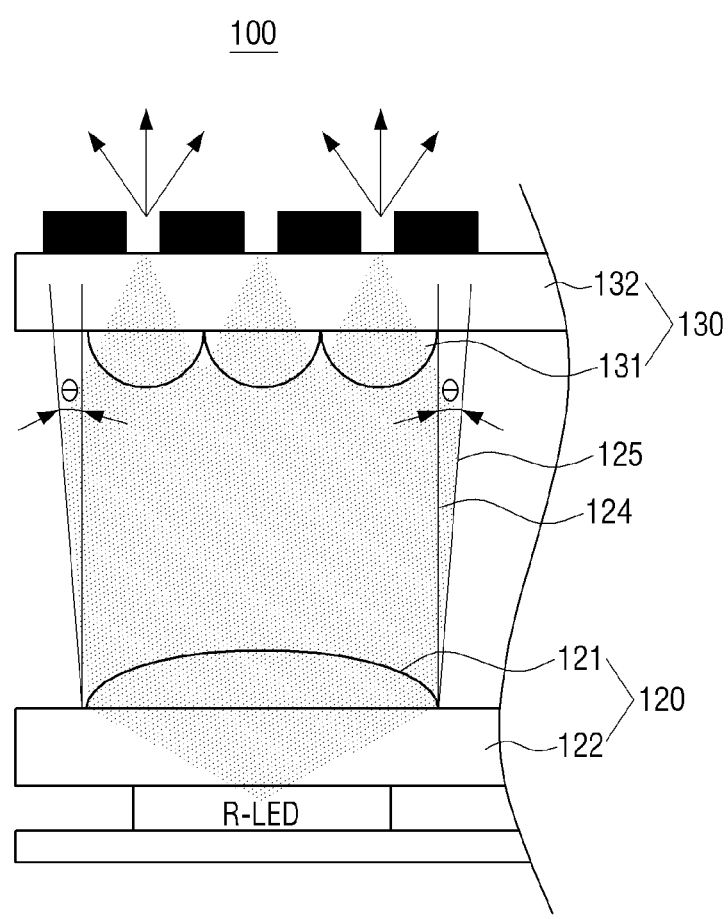
FIG. 4 is a view schematically illustrating a light bundle formed by a first micro lens of the LED display apparatus of FIG. 3.

Each of the plurality of first microlenses 121 is configured to change the path of light received from the light emitting diode 110 so as to form a light bundle that propagates toward the second microlens array 130, which is provided above the first microlens array 120. Accordingly, the light that has propagated through each of the plurality of first microlenses 121 becomes a light bundle that propagates toward the second microlens array 130. The light rays forming the light bundle are approximately parallel to one another. Accordingly, the light rays emitting from one light emitting diode 110 is redirected into approximately parallel light after passing through one first microlens 121. In particular, although the first microlens 121 is unable to redirect light rays received from one light emitting diode 110 into a light bundle of completely parallel light, the first microlens 121 may be formed so that a spread angle θ of the light that propagates from the first microlens 121 is approximately 10 degrees or less. Referring also to FIG. 4, the spread angle θ of the light refers to a deviation angle of the light 125 with respect to a vertical line 124 which is perpendicular to the surface on which the first microlens 121 is formed when the light 125 that propagates from the first microlens 121 deviates from the line 124, as illustrated in FIG. 4.

The plurality of first microlenses 121 may be formed on a surface of a first transparent sheet 122. In particular, the first microlens array 120 may be constituted of the first transparent sheet 122 and the plurality of first microlenses 121. The first transparent sheet 122 is made of a light transmitting material that allows light to propagate therethrough. More particularly, the plurality of first microlenses 121 is formed on one surface of the first transparent sheet 122, and the plurality of light emitting diodes 110 is provided on a surface opposite to the one surface of the first transparent sheet 122 on which the plurality of first microlenses 121 is formed. In this aspect, the first microlens array 120 is disposed so that the surface 122a of the first transparent sheet 122 on which the first microlenses 121 are not formed is positioned on the upper side of the plurality of light emitting diodes 110.

The second microlens array 130 is disposed at an upper side of the first microlens array 120, and includes a plurality of second microlenses 131. Each of the plurality of second microlenses 131 is configured to cause a convergence of light that has propagated through the first microlens array 120. In particular, each of the second microlens 131 is formed so as to collect the light received from the first microlenses 121 and then redirect the light toward a focus.

The second microlenses 131 of the second microlens array 130 are formed not in one-to-one correspondence with the plurality of first microlenses 121 of the first microlens array 120. In detail, the number of the second microlenses 131 is greater than the number of the first microlenses 121. For example, the ratio of the number of the first microlenses 121 and the second microlenses 131 may be 1:3. Further, the ratio of the number of the first microlenses 121 and the second microlenses 131 may be not an integer. For example, the ratio of the number of the first microlenses 121 and the second microlenses 131 may be determined as a real number, such as, for example, 1:3.2. As the number of the second microlenses 131 increases, the number of focuses upon which light emitted by the plurality of light emitting diodes 110 converges increases, and intervals between the focuses are narrowed. In this aspect, since viewers recognize the focuses formed by the second microlenses 131 as the light sources, to increase the number of the second microlenses 131 gives the effect of narrowing the intervals between the light sources.

The plurality of second microlenses 131 may be provided on one surface of a second transparent sheet 132. In particular, the second microlens array 130 may be constituted of the second transparent sheet 132 and the plurality of second microlenses 131. The second transparent sheet 132 is made of a light transmitting material that allows propagation of light therethrough. More particularly, the second microlens array 130 is disposed so that the one surface of the second transparent sheet 132 on which the plurality of second microlenses 131 is formed faces the first microlens array 120. Accordingly, a surface 132a of the second transparent sheet 132 on which the plurality of second microlenses 131 is not formed is oriented toward the outside, that is, toward the viewers. Further, each of the plurality of second microlenses 131 may be formed so that the focus of the second microlens 131 is formed in the surface 132a on which the plurality of second microlenses 131 is not formed and that is exposed to the outside, that is, the surface 132a opposite to the one surface of the second transparent sheet 132 provided with the plurality of second microlenses 131.

Figure 5:
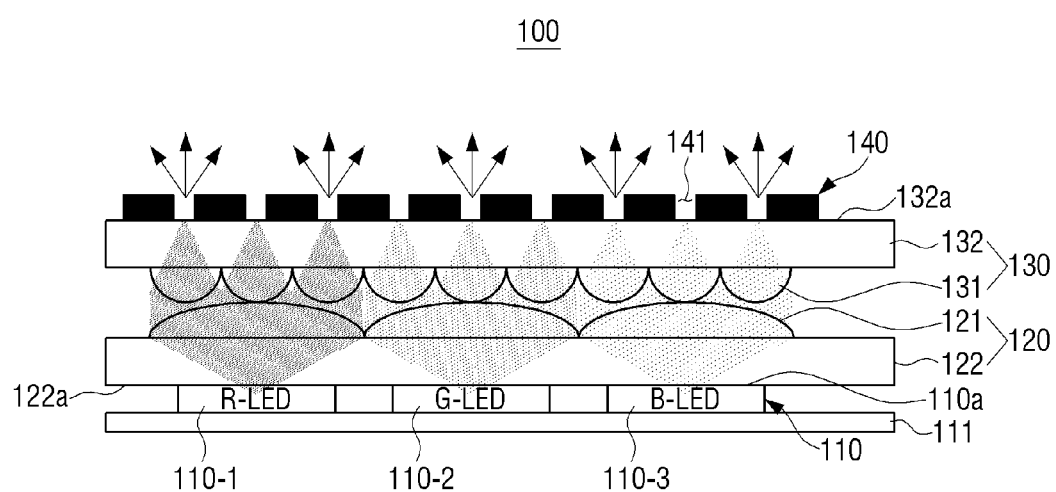
FIG. 5 is a view conceptually illustrating a variation of the LED display apparatus of FIG. 3.

In the LED display apparatus 100 as illustrated in FIG. 3, the second microlens array 130 is disposed at a predetermined distance away from the first microlens array 120. However, arrangement of the first microlens array 120 and the second microlens array 130 is not limited to this. As illustrated in FIG. 5, the second microlens array 130 may be disposed in the upper side of the first microlenses 121 in contact with the first microlens array 120. Accordingly, provided that the first microlens array 120 can collect and redirect the light received from the plurality of light emitting diodes 110 into light bundles and the second microlens array 130 can cause a convergence of the light bundles, spacing between the first microlens array 120 and the second microlens array 130 may be variably determined according to design considerations.

When the first microlens array 120 and the second microlens array 130 are disposed in sequence in the upper side of the plurality of light emitting diodes 110 as described above, the number of focuses, which is greater than the number of the plurality of light emitting diodes 110 in the same area, is formed on the surface 132*a* of the second microlens array 130 that faces the viewer. Therefore, the viewer recognizes that the distance between the focuses, that is, the distance between the point light sources, is narrowed.

Further, a light absorbing layer 140 which absorbs external light may be formed on the surface 132*a* of the second microlens array 130 that faces the user. In detail, the light absorbing layer 140 is formed on the surface 132*a* of the second microlens array 130 on which the focuses of the plurality of second microlenses 131 are formed, and includes a plurality of openings 141 which respectively correspond to the focuses of the plurality of second microlenses 131. For example, the plurality of openings 141 is formed in the upper side of the second microlens 131, and a center of each of the plurality of openings 141 corresponds to a center of each of the plurality of second microlenses 131. Each opening of the plurality of openings 141 has a diameter that is sufficient to enable the light converged by the plurality of second microlenses 131 to pass through. Accordingly, the area of the plurality of openings 141 is relatively small, as compared with the area of the top surface 110*a* of the plurality of light emitting diodes 110.

The light absorbing layer 140 is formed of a black material, in order to absorb rather than reflect light. The light absorbing layer 140 may be formed to have a structure that has a predetermined thickness and the plurality of openings 141 corresponding to the plurality of second microlenses 131. Accordingly, the arrangement of the plurality of openings 141 of the light absorbing layer 140 is formed in the same manner as the arrangement of the plurality of second microlenses 131.

Figure 6A:
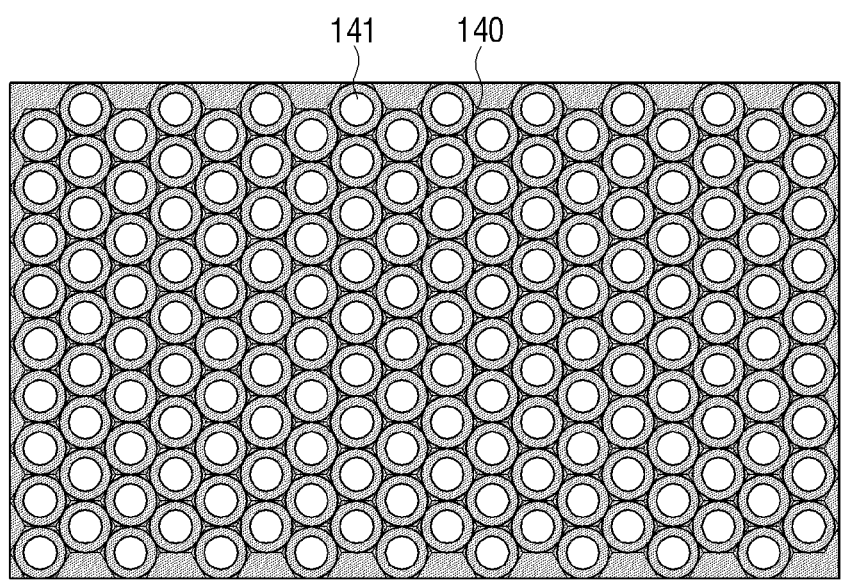
FIG. 6A is a plan view illustrating a plurality of openings of a light absorbing layer when a plurality of second microlenses of an LED display apparatus is arranged in a hexagonal shape, according to an exemplary embodiment.

For example, the plurality of second microlenses 131 may be arranged in a hexagonal shape in order to place as great a number of the second microlenses 131 as possible on the same area. In this case, as illustrated in FIG. 6A, the plurality of openings 141 of the light absorbing layer 140 may be arranged in the hexagonal shape in the same manner as the plurality of second microlenses 131. At this time, FIG. 6A is a plan view illustrating the plurality of openings of the light absorbing layer when a plurality of second microlenses of the LED display apparatus according to an exemplary embodiment is arranged in a hexagon.

Figure 6B:
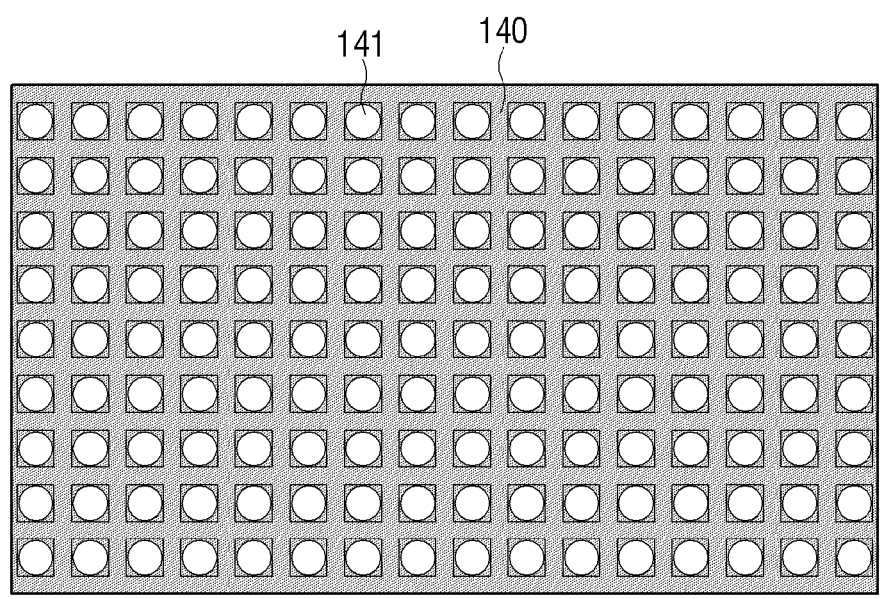
FIG. 6B is a plan view illustrating a plurality of openings of a light absorbing layer when a plurality of second microlenses of an LED display apparatus is arranged in a quadrangle lattice, according to an exemplary embodiment.

In another exemplary embodiment, the plurality of second microlenses 131 may be arranged in a lattice shape of a quadrangle such as a square, a rectangle, a rhombus, etc. In particular, the plurality of openings 141 of the light absorbing layer 140 may be also arranged in the lattice shape of a quadrangle such as a square, a rectangle, a rhombus, etc. in the same manner as the plurality of second microlenses 131. For example, if the plurality of second microlenses 131 is arranged in a square shape, as illustrated in FIG. 6B, the plurality of openings 141 of the light absorbing layer 140 may be also arranged in a square lattice shape in the same manner as the plurality of second microlenses 131. In particular, FIG. 6B is a plan view illustrating a plurality of openings of a light absorbing layer when a plurality of second microlenses of the LED display apparatus according to an exemplary embodiment is arranged in a square lattice shape.

As described above, when the light absorbing layer 140 is disposed on the surface 132*a* of the second microlens array 130, the external light can be reflected through only the plurality of openings 141 of the light absorbing layer 140, so that reflectivity of the external light can be reduced.

Hereinafter, a process via which external light is reflected in the LED display apparatus 100 according to an exemplary embodiment will be described with reference to FIG. 7.

Figure 7:
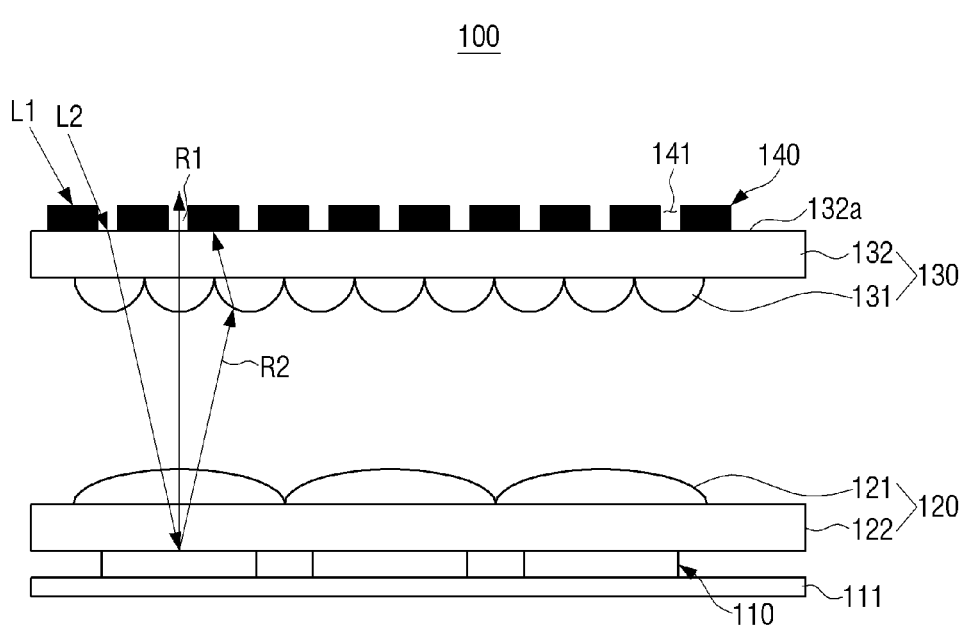
FIG. 7 is a view for explaining reflection of external light in the LED display apparatus of FIG. 3.

FIG. 7 is a view for describing a reflection of external light in the LED display apparatus, according to the exemplary embodiment illustrated in FIG. 3.

Most of external light L1 is incident to the light absorbing layer 140 provided on the surface 132*a* of the second microlens array 130. The external light L1 incident to the light absorbing layer 140 is reflected according to the reflectivity of the light absorbing layer 140, and therefore, due to absorption by the light absorbing layer 140, most of the external light L1 is not reflected to the outside.

Some of the external light L2 passes through the openings 141 of the light absorbing layer 140, and propagates toward the first microlens array 120. A portion of the external light L2 that has propagated to the first microlens array 120 is reflected by the surface of the plurality of first microlenses 121, and a portion of the external light L2 is reflected by the surface of the plurality of light emitting diodes 110. Some of the light R1 reflected by the surface of the plurality of light emitting diodes 110 passes through the plurality of openings 141 of the light absorbing layer 140, and is reflected to the outside. However, most of the reflected light R2 is refracted by the second microlens 131, and is incident to the light absorbing layer 140 formed on the surface 132*a* of the second microlens array 130.

As described above, in the LED display apparatus 100 according to an exemplary embodiment, because only some R1 of the external light L2 incident to the lower side of the second microlens array 130 through the plurality of openings 141 of the light absorbing layer 140 is reflected by the plurality of light emitting diodes 110 and again emitted to the outside through the plurality of openings 141 of the light absorbing layer 140, the reflectivity of the LED display apparatus 100 may be reduced.

In detail, in the conventional LED display apparatus, the reflectivity is proportional to the surface area of the plurality of light emitting diodes 5, but the reflectivity of the LED display apparatus 100 according to an exemplary embodiment is proportional to the area of the plurality of openings 141 of the light absorbing layer 140. In this aspect, the area of the plurality of openings 141 of the light absorbing layer 140 is smaller than the area of the plurality of light emitting diodes 110, so that the reflectivity of the external light of the LED display apparatus 100 according to an exemplary embodiment is smaller than that of the conventional LED display apparatus.

In particular, the area of the plurality of openings 141 of the light absorbing layer 140 may vary based on the degree to which the light bundle made by the first microlenses 121 is provided in parallel. In the best case, if the light bundles formed by the first microlenses 121 are provided to be completely parallel light and the second microlens 131 are ideal lenses, the light focus formed by each of the second microlenses 131 may approximate a point, of which the area is very small. In this case, it is possible to make the total area of the plurality of openings 141 equal to 0.1% or less of the total area of the light absorbing layer 140. Accordingly, it is also possible to make the reflectivity of the external light of the LED display apparatus 100 less than 0.1%.

However, in general, since it is very difficult to form the lens with such an ideal shape, the light bundle to be formed through the first microlens 121 will not provide perfectly parallel light. In addition, since it is difficult to form the second microlens 131 to have an ideal shape, the light converged through the second microlens 131 forms a focus having a certain (i.e., nonzero) area. Accordingly, the total area of the plurality of openings 141 is larger than 0.1% of the total area of the light absorbing layer 140. However, because the area of the plurality of openings 141 is very small compared to the area of the plurality of light emitting diodes 110, the light reflectivity of the LED display apparatus 100 according to an exemplary embodiment is very low.

The plurality of openings 141 may be formed by using a self-aligning methodology. For example, when the light absorbing layer 140 is formed of a photosensitive material and the plurality of light emitting diodes 110 is turned on to emit light, the light passing through the plurality of first microlenses 121 and the plurality of second microlenses 131 forms a plurality of focuses on the light absorbing layer 140. Then, when the portions of the light absorbing layer 140 for which a light absorbing property has been changed by the light irradiation are removed through etching, the plurality of openings 141 which corresponds exactly to the focuses of the plurality of second microlenses 131 is formed.

As described above, since the area reflecting the external light in the surface of the LED display apparatus 100 according to an exemplary embodiment is reduced to the total area of the plurality of openings 141, the reflectivity of the LED display apparatus 100 is reduced significantly, as compared with the conventional LED display apparatus in which the external light is reflected by the surface of the plurality of light emitting diodes. Accordingly, in the LED display apparatus 100 according to an exemplary embodiment, the bright room contrast is improved, as compared with the conventional LED display apparatus.

In the above description, the first and second microlens arrays 120 and 130 include the first transparent sheet 122 and the second transparent sheet 132, respectively. However, alternatively, the first and second microlens arrays 120 and 130 may be formed without the transparent sheets 122 and 132.

Figure 8:
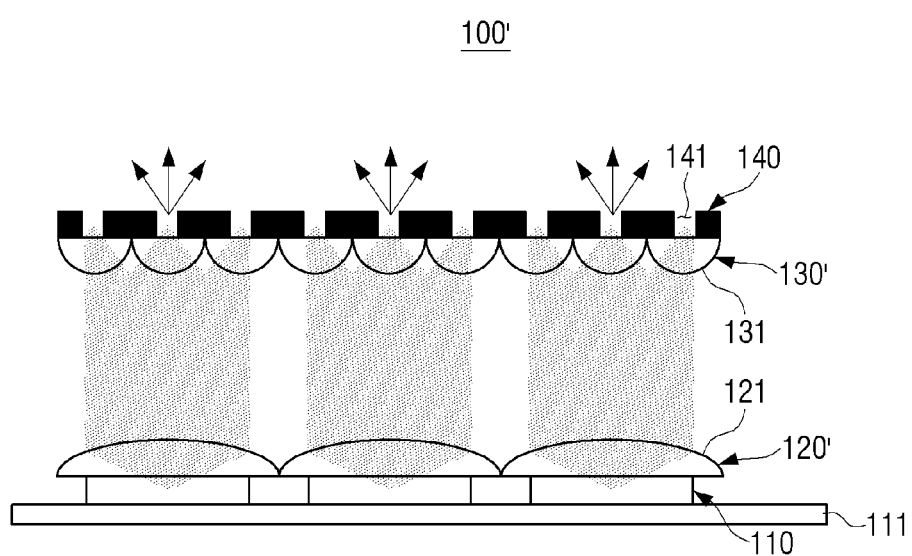
FIG. 8 is a view illustrating another variation of the LED display apparatus of FIG. 3.

FIG. 8 is a view illustrating another variation of the LED display apparatus, according to an exemplary embodiment.

Referring to FIG. 8, an LED display apparatus 100' according to an exemplary embodiment includes a plurality of light emitting diodes 110, a first microlens array 120', a second microlens array 130', and a light absorbing layer 140.

The plurality of light emitting diodes 110 and the light absorbing layer 140 are the same as those of the LED display apparatus 100 as described above.

The first microlens array 120' is provided with the plurality of first microlenses 121 formed integrally, and is different from the first microlens array 120 as described above in that the first microlens array 120' does not include the first transparent sheet on which the plurality of first microlenses 121 is formed in the manner illustrated in FIG. 3. However, that the first microlens array 120' redirects the light received from the plurality of light emitting diodes 110 into the light bundles is the same as the first microlens array 120 of the above-described exemplary embodiment.

In addition, the second microlens array 130' is provided with the plurality of second microlenses 131 formed integrally, and is different from the second microlens array 130 of above-described exemplary embodiment in that the second microlens array 130' does not include the second transparent sheet on which the plurality of second microlenses 131 is formed in the manner illustrated in FIG. 3. However, that the second microlens array 130' causes a convergence of the light received from the first microlens array 120' is the same as the second microlens array 130 of the above-described exemplary embodiment.

In the LED display apparatus 100' as illustrated in FIG. 8, the first microlens array 120' does not include the first transparent sheet 122, and the second microlens array 130 does not include the second transparent sheet 132. However, its function is the same as that of the LED display apparatus 100 according to the above-described exemplary embodiment, so the detailed description thereof is omitted.

The plurality of light emitting diodes 110 used in the LED display apparatuses 100 and 100' as described above may include a plurality of red light emitting diodes, a plurality of green light emitting diodes, and a plurality of blue light emitting diodes, respectively so that the LED display apparatuses 100 and 100' can display a color image.

However, there is no need to configure the plurality of light emitting diodes 110 to include all of the red light emitting diodes, the green light emitting diodes, and the blue light emitting diodes. The LED display apparatus according to an exemplary embodiment may use a variety of colors and types of light emitting diodes. Hereinafter, exemplary embodiments of the LED display apparatus according to the type of the light emitting diodes to be used will be described.

Figure 9:
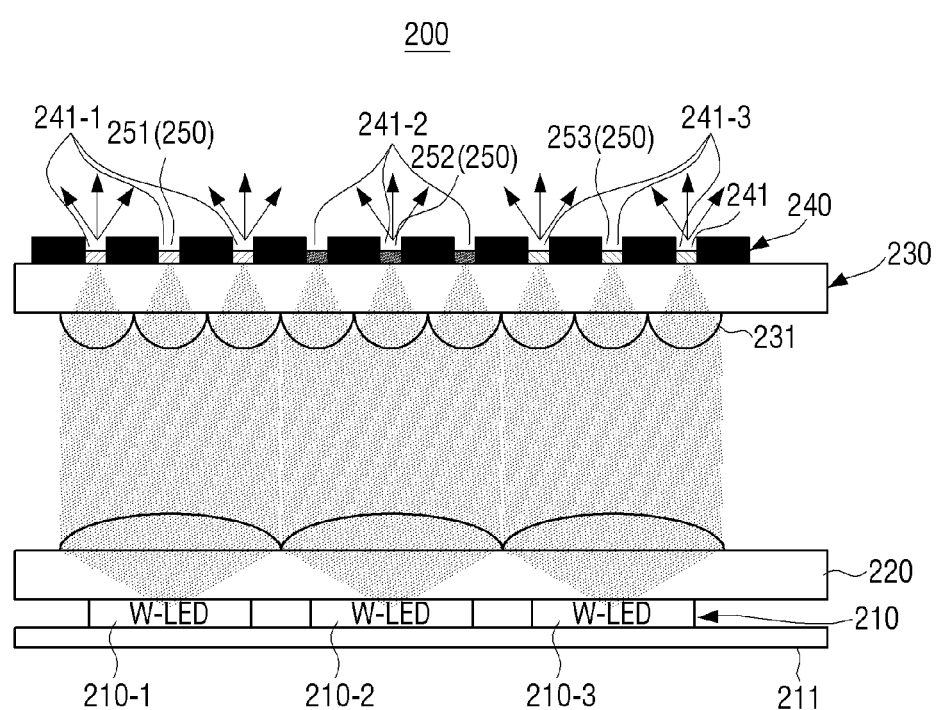
FIG. 9 is a view conceptually illustrating an LED display apparatus according to another exemplary embodiment.

FIG. 9 is a view conceptually illustrating an LED display apparatus, according to an exemplary embodiment.

Referring to FIG. 9, an LED display apparatus 200 according to an exemplary embodiment includes a plurality of light emitting diodes 210, a first microlens array 220, a second microlens array 230, and a light absorbing layer 240.

The plurality of light emitting diodes 210 uses a plurality of white light emitting diodes 210-1, 210-2, 210-3 which are configured to emit white light. The plurality of white light emitting diodes 210 is disposed on a printed circuit board 211.

The first microlens array 220 and the second microlens array 230 are disposed in sequence at the upper side of the plurality of white light emitting diodes 210. The structures of the first and second microlens arrays 220 and 230 are the same as those of the first and second microlens arrays 120 and 130 of the LED display apparatus 100 according to an exemplary embodiment as described above. Therefore, detailed descriptions thereof are omitted.

The light absorbing layer 240 is formed on the surface of the second microlens array 230, and has a plurality of openings 241 which respectively correspond to a plurality of second microlenses 231. A color filter 250 is formed in each of the plurality of opening 241. In detail, the plurality of openings 241 is provided with a plurality of red color filters 251, a plurality of green color filters 252, and a plurality of blue color filters 253. For example, when a first opening 241 is provided with a red color filter 251, a second opening 241 that is adjacent thereto may be provided with a green color filter 252, and a third opening 241 that is adjacent thereto may be provided with a blue color filter 253.

Alternatively, a plurality of openings 241 that corresponds to one light emitting diode 210, that is, the plurality of openings 241 through which the light emitted by the one light emitting diode 210 passes may be provided with the same color filters 250. For example, as illustrated in FIG. 9, the plurality of openings 241-1 that corresponds to a first white light emitting diode 210-1 is provided with red color filters 251, the plurality of openings 241-2 that corresponds to a second white light emitting diode 210-2 is provided with green color filters 252, and the plurality of openings 241-3 that corresponds to a third white light emitting diode 210-3 is provided with blue color filters 253. With this configuration, intensity of the red light, green light, and blue light may be controlled, respectively, by controlling one type of light emitting diodes, that is, the white light emitting diodes 210.

If the plurality of light emitting diodes 210 includes only white light emitting diodes, the white light emitting diode that has an efficiency which is better than an efficiency of the red, green, and blue light emitting diodes may be used. Therefore, the efficiency of the LED display apparatus 200 may be improved. Further, since the plurality of openings 241 of the light absorbing layer 240 is provided with the color filters 250, an amount of the external light passing through the plurality of openings 241 is further reduced to ⅓ of the previous amount. Accordingly, the reflectivity of the LED display apparatus 200 according to an exemplary embodiment is reduced to less than ⅓ of the reflectivity of the LED display apparatus 100 according to an exemplary embodiment as described above with respect to FIG. 3.

Hereinafter, the case of using only blue light emitting diodes as the plurality of light emitting diodes will be described with reference to FIG. 10.

Figure 10:
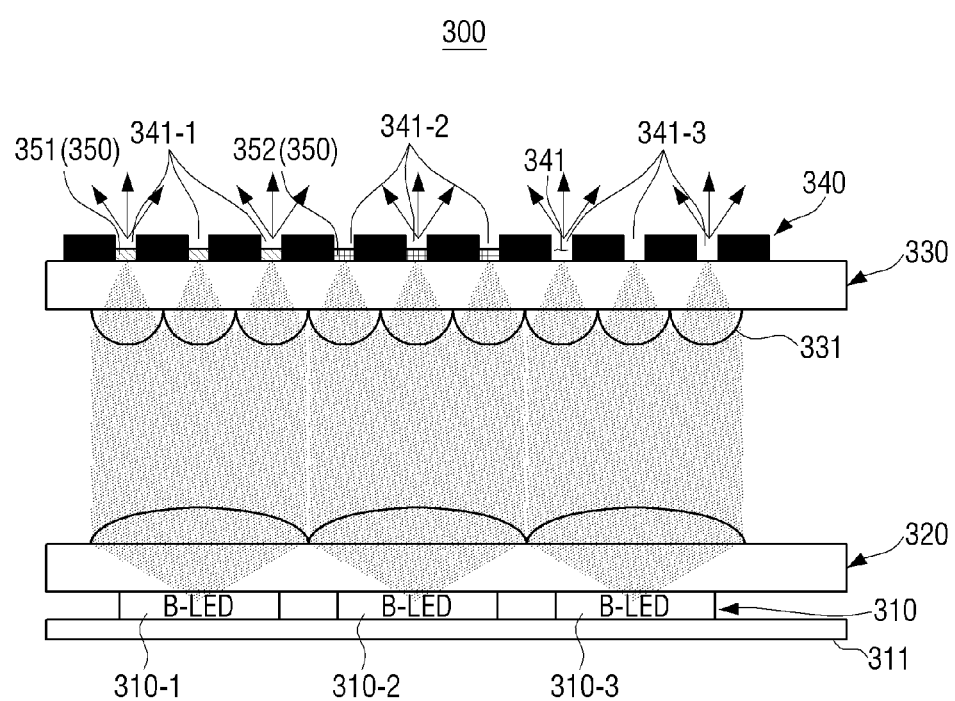
FIG. 10 is a view conceptually illustrating an LED display apparatus according to another exemplary embodiment.

FIG. 10 is a view conceptually illustrating an LED display apparatus, according to an exemplary embodiment.

Referring to FIG. 10, an LED display apparatus 300 according to an exemplary embodiment includes a plurality of light emitting diodes 310, a first microlens array 320, a second microlens array 330, and a light absorbing layer 340.

The plurality of light emitting diodes 310 uses a plurality of blue light emitting diodes 310-1, 310-2, 310-3 which are configured to emit blue light. The plurality of blue light emitting diodes 310 is disposed on a printed circuit board 311.

The first microlens array 320 and the second microlens array 330 are disposed in sequence at the upper side of the plurality of blue light emitting diodes 310. The structures of the first and second microlens arrays 320 and 330 are the same as those of the first and second microlens arrays 120 and 130 of the LED display apparatus 100 according to an exemplary embodiment as described above with respect to FIG. 3. Therefore, detailed descriptions thereof are omitted.

The light absorbing layer 340 is formed on the surface of the second microlens array 330, and has a plurality of openings 341 which respectively correspond to a plurality of second microlenses 331. A light wavelength conversion layer 350 is formed in each of the plurality of openings 341. In detail, the plurality of openings 341 is provided with a plurality of red light wavelength conversion layer elements 351 that are capable of converting blue light emitted by the blue light emitting diodes 310 into red light, and a plurality of green light wavelength conversion layer elements 352 that are capable of converting the blue light into green light. For example, when one opening 341 is provided with a red light wavelength conversion layer element 351, an adjacent opening 241 may be provided with a green light wavelength conversion layer element 352. Phosphor, quantum dots, or the like may be used as the light wavelength conversion layer element 350.

However, the opening 341 that corresponds to the blue light is not provided with the light wavelength conversion layer element 350, but is maintained as a space through which the blue light emitted by the blue light emitting diodes 310 can pass.

At this time, a plurality of openings 341 that corresponds to a single blue light emitting diode 310, that is, the plurality of openings 341 through which the blue light emitted by the single light emitting diode 310 passes, may be provided with the same light wavelength conversion layer element 350. For example, as illustrated in FIG. 10, the plurality of openings 341-1 that corresponds to a first blue light emitting diode 310-1 is provided with the red light wavelength conversion layer element 351 which is configured to convert the blue light into red light, and the plurality of openings 341-2 that corresponds to a second blue light emitting diode 310-2 is provided with the green light wavelength conversion layer element 352 which is configured to convert the blue light into green light. However, the plurality of openings 341-3 that corresponds to a third blue light emitting diode 310-3 is not provided with the light wavelength conversion layer element, so that the blue light can pass through the plurality of openings 341-3 as it is. With this configuration, intensity of the red light, green light, and blue light may be controlled, respectively, by controlling only the blue light emitting diode 310.

Further, in the case of the present exemplary embodiment, because the first microlens array 320 and the second microlens array 330 are designed with respect to only the blue light so that the lens aberration based on the wavelength of the light is reduced, the diameter of the opening 341 may be reduced as compared with that of the opening 141 of the LED display apparatus 100 according to the exemplary embodiment as described above with respect to FIG. 3. Accordingly, the reflection area of the LED display apparatus 300 according to an exemplary embodiment becomes smaller than the reflection area of the LED display apparatus 100 according to the above-described exemplary embodiment, and the reflectivity is also reduced.

Figure 11:
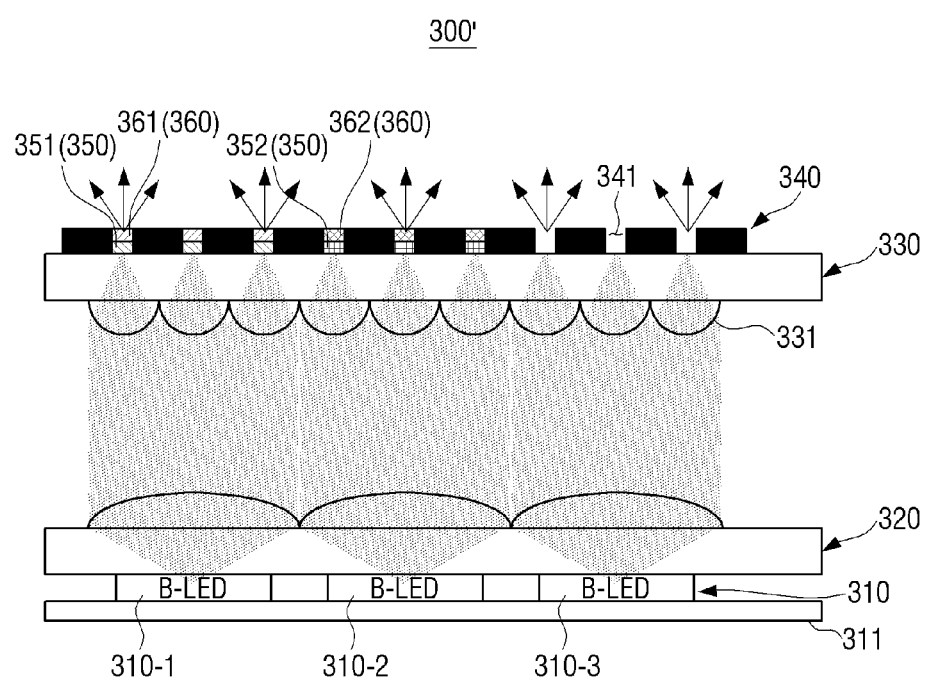
FIG. 11 is a view conceptually illustrating a variation of the LED display apparatus of FIG. 10.

FIG. 11 is a view conceptually illustrating a variation of the LED display apparatus according to an exemplary embodiment.

Referring to FIG. 11, that an LED display apparatus 300' according to the present exemplary embodiment uses the blue light emitting diodes 310 to emit the blue light similarly as the plurality of light emitting diodes 310 is the same as the above-described LED display apparatus 300 of FIG. 10.

Further, the first microlens array 320 and the second microlens array 330 are the same as those of the LED display apparatus 300 according to the above-described exemplary embodiment.

In addition, that the plurality of openings 341 of the light absorbing layer 340 is provided with the red light wavelength conversion layer elements 351 in order to convert the blue light into the red light and the green light wavelength conversion layer elements 352 in order to convert the blue light into the green light is the same as the LED display apparatus 300 according to the above-described exemplary embodiment.

However, that a color filter 360 is further disposed on the upper side of the light wavelength conversion layer 350 provided in the opening 341 is different from the LED display apparatus 300 according to the above-described exemplary embodiment. In detail, a red color filter 361 is disposed at the upper side of the red light wavelength conversion layer 351, and a green color filter 362 is disposed at the upper side of the green light wavelength conversion layer 352. The opening 241 that is provided with no light wavelength conversion layer 350 and corresponds to the blue light is not provided with the blue color filter.

In the case in that the light wavelength conversion layer 350 and the color filter 360 are stacked in the LED display apparatus 300' as illustrated in FIG. 11, if there is some blue light which is not converted by the light wavelength conversion layer 350, the color filter 360 converts the unconverted blue light into light of a color that corresponds to the color filter 360. Therefore, the image quality of the LED display apparatus 300' according to the present exemplary embodiment may be improved, as compared with the LED display apparatus 300 according to above-described exemplary embodiment, which is configured to convert the blue light by using only the light wavelength conversion layer 350.

Hereinafter, the case of using only ultraviolet light emitting diodes (UV LEDs) as the plurality of light emitting diodes will be described with reference to FIG. 12.

Figure 12:
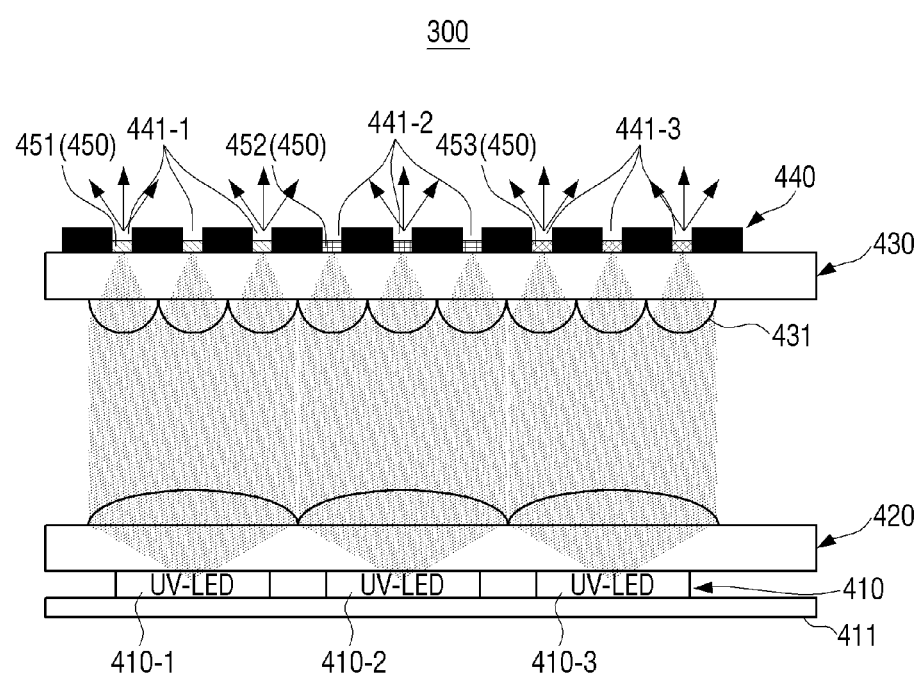
FIG. 12 is a view conceptually illustrating an LED display apparatus according to another exemplary embodiment.

FIG. 12 is a view conceptually illustrating an LED display apparatus, according to an exemplary embodiment.

Referring to FIG. 12, an LED display apparatus 400 according to an exemplary embodiment includes a plurality of light emitting diodes 410, a first microlens array 420, a second microlens array 430, and a light absorbing layer 440.

The plurality of light emitting diodes 410 uses a plurality of ultraviolet light emitting diodes 410-1, 410-2, 410-3 which are configured to emit ultraviolet rays.

The first microlens array 420 and the second microlens array 430 are disposed in sequence at the upper side of the plurality of ultraviolet light emitting diodes 410. The structures of the first and second microlens arrays 420 and 430 are the same as those of the first and second microlens arrays 120 and 130 of the LED display apparatus 100 according to the exemplary embodiment as described above with respect to FIG. 3. Therefore, detailed descriptions thereof are omitted.

The light absorbing layer 440 is formed on the surface of the second microlens array 430, and has a plurality of openings 441 which respectively correspond to a plurality of second microlenses 431. A light wavelength conversion layer 450 is formed in each of the plurality of openings 441. In detail, the plurality of openings 341 is provided with a plurality of red light wavelength conversion layer elements 451 that are capable of converting ultraviolet light emitted by the ultraviolet light emitting diodes 410 into red light, a plurality of green light wavelength conversion layer elements 452 that are capable of converting the ultraviolet light into green light, and a plurality of blue light wavelength conversion layer elements 453 that are capable of converting the ultraviolet into blue light. For example, when one opening 441 is provided with a red light wavelength conversion layer element 451, another opening 441 which is adjacent thereto may be provided with a green light wavelength conversion layer element 452, and still another opening 441 which is adjacent thereto may be provided with a blue light wavelength conversion layer element 453. The phosphor, the quantum dots, or the like may be used as the light wavelength conversion layer element 450.

In this aspect, a plurality of openings 441 that correspond to a single ultraviolet light emitting diode 410, that is, the plurality of openings 441 through which the ultraviolet light emitted by the single ultraviolet light emitting diode 410 passes, may be provided with the same type of light wavelength conversion layer element 450. For example, as illustrated in FIG. 12, the plurality of openings 441-1 that corresponds to a first ultraviolet light emitting diode 410-1 is provided with the red light wavelength conversion layer element 451 which is configured to convert the ultraviolet into red light, and the plurality of openings 441-2 that corresponds to a second ultraviolet light emitting diode 410-2 is provided with the green light wavelength conversion layer element 452 which is configured to convert the ultraviolet into green light. In addition, the plurality of openings 441-3 that corresponds to a third ultraviolet light emitting diode 410-3 is provided with the blue light wavelength conversion layer element 453 which is configured to convert the ultraviolet into blue light. With this configuration, intensity of the red light, green light, and blue light may be controlled, respectively, by controlling only the ultraviolet light emitting diode 410.

In addition, in the case of the present exemplary embodiment, because the first microlens array 420 and the second microlens array 430 are designed with respect to only the ultraviolet light, so that the lens aberration based on the wavelength of the light is reduced, the diameter of the opening 441 may be reduced as compared with that of the opening 141 of the LED display apparatus 100 according to the exemplary embodiment as described above with respect to FIG. 3. Accordingly, the reflection area of the LED display apparatus 400 according to an exemplary embodiment becomes smaller than the reflection area of the LED display apparatus 100 according to the above-described exemplary embodiment, and the reflectivity is also reduced.

Hereinafter, an LED display apparatus having first microlenses formed integrally with light emitting diodes will be described with reference to FIG. 13.

Figure 13:
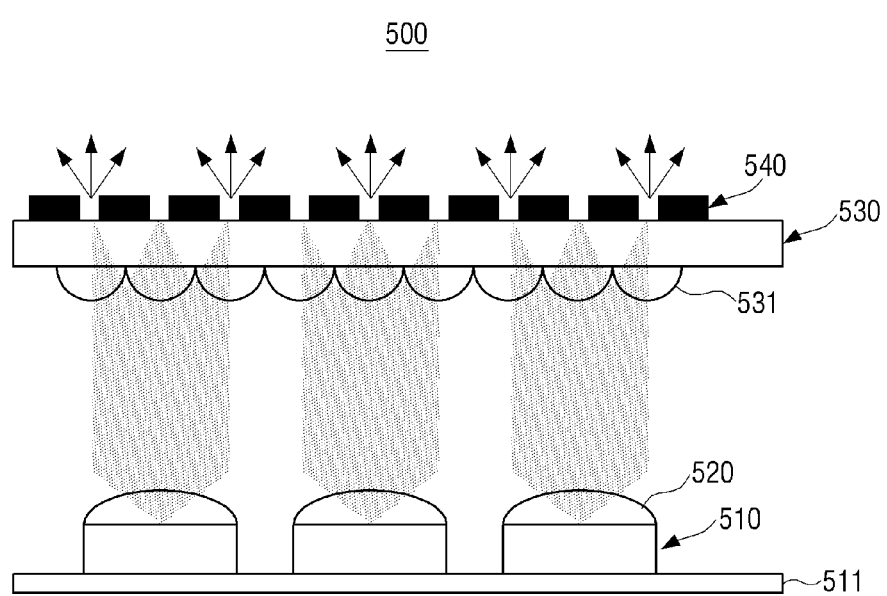
FIG. 13 is a view conceptually illustrating an LED display apparatus according to another exemplary embodiment.

FIG. 13 is a view conceptually illustrating an LED display apparatus, according to an exemplary embodiment.

Referring to FIG. 13, an LED display apparatus 500 according to an exemplary embodiment includes a plurality of light emitting diodes 510, a plurality of first microlenses 520, a second microlens array 530, and a light absorbing layer 540.

The plurality of light emitting diodes 510 is disposed on the upper surface of a printed circuit board 511, and operates to display a variety of image information. The plurality of light emitting diodes 510 may include a plurality of red light emitting diodes, a plurality of green light emitting diodes, and a plurality of blue light emitting diodes so that the LED display apparatus 500 can display a color image.

The plurality of first microlenses 520 is formed on the top surfaces of the plurality of light emitting diodes 510, respectively. In detail, the first microlens 520 is a portion of a molding of the light emitting diode 510 which is formed as a lens that can redirect the light emitted by the light emitting diode 510 into a light bundle. Accordingly, because the first microlens 520 is formed integrally with the light emitting diode 510, the LED display apparatus 500 according to the present exemplary embodiment does not require the first microlens array, unlike the above-described exemplary embodiments of the LED display apparatuses 100, 200, 300, and 400. In particular, in the LED display apparatus 500 according to the present exemplary embodiment, the plurality of first microlenses 520 formed integrally with the light emitting diodes 510 on the top surfaces of the plurality of light emitting diodes 510 serves as the first microlens array, so that a separate first microlens array structure is not required.

The second microlens array 530 and the light absorbing layer 540 are the same as the second microlens array 130 and the light absorbing layer 140 of the above-described LED display apparatus 100 according to the above-described exemplary embodiment. Therefore, detailed descriptions thereof are omitted.

In the exemplary embodiment as illustrated in FIG. 13, the plurality of light emitting diodes 510 includes all of red light emitting diodes, green light emitting diodes, and blue light emitting diodes. The plurality of opening 541 of the light absorbing layer 540 is not provided with color filters or light wavelength conversion layer elements.

However, the configuration embodied by forming the first microlenses 520 integrally with the light emitting diodes 510 may be also applied to the above-described LED display apparatuses 200, 300, and 400 according to the above-described exemplary embodiments.

In detail, when the first microlenses that are configured to make light bundles are formed integrally with the white light emitting diodes, the plurality of openings of the light absorbing layer is provided with color filters. Further, when the first microlenses are formed integrally with the blue light emitting diodes, the plurality of openings of the light absorbing layer is provided with light wavelength conversion layer elements. In addition, when the first microlenses are formed integrally with the ultraviolet light emitting diodes, the plurality of openings of the light absorbing layer is provided with the light wavelength conversion layer elements.

In the LED display apparatus according to an exemplary embodiment as described above, the area reflecting the external light of the surface facing the viewer is the total area of the plurality of openings, and the total area of the plurality of openings is less than the total area of the plurality of light emitting diodes. Accordingly, the reflectivity of the LED display apparatus according to an exemplary embodiment is reduced significantly, as compared with the conventional LED display apparatus in which the external light is reflected by the surfaces of the plurality of light emitting diodes. Therefore, the LED display apparatus according to an exemplary embodiment has an improved bright room contrast quality, as compared with the conventional LED display apparatus.

While exemplary embodiments have been described above, additional variations and modifications of the exemplary embodiments may occur to those of skill in the art. Therefore, it is intended that the appended claims shall be construed to include both the above-described exemplary embodiments and all such variations and modifications that fall within the spirit and scope thereof.

What is claimed is:

1. A light emitting diode (LED) display apparatus comprising:
   a plurality of light emitting diodes;
   a first microlens array disposed at an upper side of the plurality of light emitting diodes, the first microlens array comprising a plurality of first microlenses, each respective one of which corresponds to a respective one of the plurality of light emitting diodes, and which is configured to redirect light received from the plurality of light emitting diodes into light bundles; and
   a second microlens array disposed at an upper side of the first microlens array, the second microlens array comprising a plurality of second microlenses, a number of which is greater than a number of the first microlenses included in the first microlens array, each of the plurality of second microlenses being configured to cause a convergence of light that has propagated through the first microlens array.

2. The LED display apparatus of claim 1, further comprising:
   a light absorbing layer which is disposed on a surface of the second microlens array upon which focuses of the plurality of second microlenses are formed, and which comprises a plurality of openings that respectively correspond to the focuses of the plurality of second microlenses.

3. The LED display apparatus of claim 2, wherein at least one opening from among the plurality of openings is provided with a respective color filter.

4. The LED display apparatus of claim 3, wherein the plurality of light emitting diodes comprises at least one white light emitting diode configured to emit white light.

5. The LED display apparatus of claim 2, wherein at least one from among the plurality of openings is provided with a respective light wavelength conversion layer element.

6. The LED display apparatus of claim 5, wherein the plurality of light emitting diodes comprises at least one blue light emitting diode configured to emit blue light.

7. The LED display apparatus of claim 6, wherein at least one from among the plurality of openings is provided with a respective color filter disposed at an upper side of a corresponding light wavelength conversion layer element.

8. The LED display apparatus of claim 5, wherein the plurality of light emitting diodes comprises at least one ultraviolet light emitting diode configured to emit ultraviolet light.

9. The LED display apparatus of claim 5, wherein each respective light wavelength conversion layer element comprises at least one from among a phosphor and a quantum dot.

10. The LED display apparatus of claim 1, wherein the plurality of light emitting diodes comprises at least one red light emitting diode, at least one green light emitting diode, and at least one blue light emitting diode.

11. The LED display apparatus of claim 1, wherein the plurality of light emitting diodes comprises at least one LED package that includes at least one red light emitting diode, at least one green light emitting diode, and at least one blue light emitting diode.

12. The LED display apparatus of claim 1, wherein the plurality of second microlenses is arranged in one from among a quadrangle shape and a hexagonal shape.

13. The LED display apparatus of claim 1, wherein the first microlens array comprises a first transparent sheet on which the plurality of first microlenses is formed, and
wherein the plurality of first microlenses is formed on a first surface of the first transparent sheet, and the plurality of light emitting diodes is provided on a second surface of the first transparent sheet which is opposite to the first surface of the first transparent sheet.

14. The LED display apparatus of claim 1, wherein each of the plurality of first microlenses is formed integrally with a corresponding one of the plurality of light emitting diodes on a top surface of the corresponding one of the plurality of light emitting diodes.

15. The LED display apparatus of claim 1, wherein the second microlens array comprises a second transparent sheet on which the plurality of second microlenses is formed, and
wherein the plurality of second microlenses is formed on a first surface of the second transparent sheet and arranged so as to face the first microlens array.

16. The LED display apparatus of claim 15, wherein focuses of the plurality of second microlenses are formed on a second surface of the second transparent sheet which is opposite to the first surface of the second transparent sheet.

17. A light emitting diode (LED) display apparatus comprising:
- a plurality of light emitting diodes;
- a first microlens array disposed at an upper side of the plurality of light emitting diodes, the first microlens array comprising a plurality of first microlenses, each respective one of which corresponds to a respective one of the plurality of light emitting diodes, and which is configured to redirect light received from the plurality of light emitting diodes into light bundles;
- a second microlens array disposed at an upper side of the first microlens array, the second microlens array comprising a plurality of second microlenses, a number of which is greater than a number of the first microlenses included in the first microlens array, the second microlens array being configured to cause a convergence of light that has propagated through the first microlens array; and
- a light absorbing layer which is disposed on a surface of the second microlens array upon which focuses of the plurality of second microlenses are formed, and which comprises a plurality of openings that respectively correspond to the focuses of the plurality of second microlenses.

18. The LED display apparatus of claim 17, wherein
the plurality of light emitting diodes comprises at least one red light emitting diode, at least one green light emitting diode, and at least one blue light emitting diode.

19. The LED display apparatus of claim 17, wherein
at least one from among the plurality of openings is provided with at least one from among a respective red color filter, a respective green color filter, and a respective blue color filter, and
the plurality of light emitting diodes comprises at least one white light emitting diode configured to emit white light.

20. The LED display apparatus of claim 17, wherein
at least one from among the plurality of openings is provided with a respective light wavelength conversion layer element, and
the plurality of light emitting diodes comprises at least one from among at least one blue light emitting diode configured to emit blue light and at least one ultraviolet light emitting diode configured to emit ultraviolet light.

* * * * *